United States Patent [19]
Schmedding

[11] Patent Number: 5,358,417
[45] Date of Patent: Oct. 25, 1994

[54] SURFACE MOUNTABLE ELECTRICAL CONNECTOR

[75] Inventor: George R. Schmedding, Hummelstown, Pa.

[73] Assignee: The Whitaker Corporation, Wilmington, Del.

[21] Appl. No.: 113,461

[22] Filed: Aug. 27, 1993

[51] Int. Cl.⁵ .......................................... H01R 13/44
[52] U.S. Cl. ..................................... 439/178; 439/493
[58] Field of Search .................. 439/86, 67, 178, 179, 439/493, 495, 499, 930

[56] References Cited

U.S. PATENT DOCUMENTS

| | | | |
|---|---|---|---|
| 3,855,567 | 12/1974 | Harms et al. | 439/493 |
| 4,770,641 | 9/1988 | Rowlette | 439/178 |
| 4,886,942 | 12/1989 | Lenz et al. | 439/493 |
| 4,955,814 | 9/1990 | Christie et al. | 439/498 |
| 5,076,803 | 12/1991 | Mutavelli et al. | 439/493 |
| 5,122,064 | 6/1992 | Zarreii | 439/65 |

Primary Examiner—Gary F. Paumen
Assistant Examiner—Hien D. Vu
Attorney, Agent, or Firm—William B. Noll

[57] ABSTRACT

The disclosure teaches an electrical connector of the type for electrically interconnecting a powered device to a power supply, preferably with a surface mounting or abutting connection. The connector comprises an elongated housing having plural, axially oriented through holes of a first diameter, where each hole is adapted to snugly receive an electrical conductor to electrically interconnect the device to the power supply. The housing includes a like plurality of concentric recesses, one about each hole at one end face of the housing, where the diameter of the recess is greater than the first diameter. A conductor is provided within each through hole, where the end thereof is in communication with the recess. Further, means cooperating with the housing to fixedly secure said conductors within the through holes is provided. Finally, quantities of an electrically conductive gel is inserted into each recess extending between the conductor end to beyond the end face to form a conductive gel lead, whereby the housing may be mounted between the powered device and the power supply to effect an electrical interconnection therebetween.

6 Claims, 3 Drawing Sheets

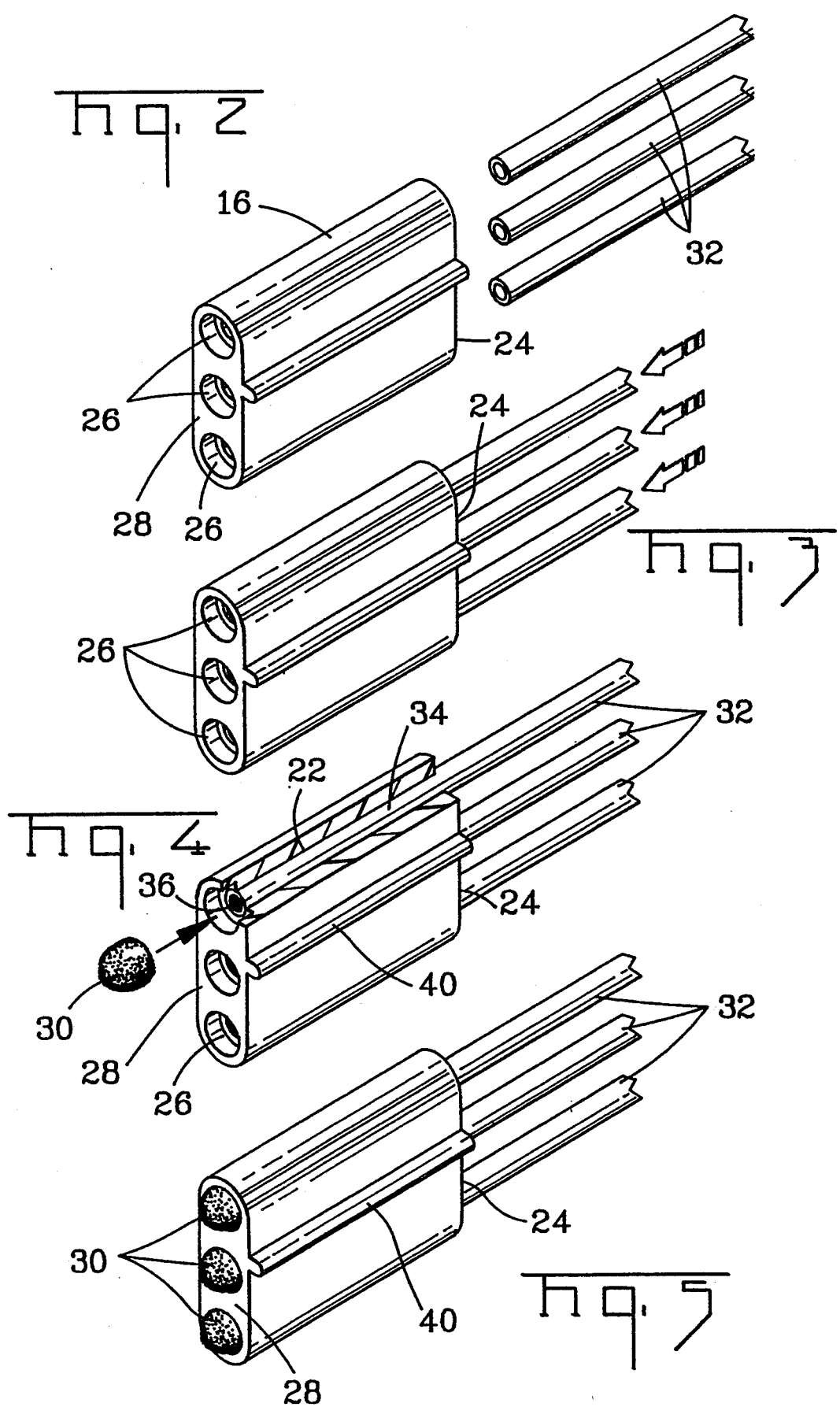

SURFACE MOUNTABLE ELECTRICAL CONNECTOR

RELATED APPLICATION

This invention represents an improvement and/or extension of the invention disclosed and claimed in copending application, U.S. Ser. No. 08/021,837, filed Feb. 24, 1993.

BACKGROUND OF THE INVENTION

The invention relates to an electrical connector of the type for electrically interconnecting a powered device to a power supply, preferably with a surface mounting or abutting connection.

In a preferred embodiment, the power supply may comprise a planar electronic device such as a printed circuit board or a processor chip, where the device is provided with plural contacts, typically in the form of pads, along the planar surface thereof. A difficulty of prior art systems to surface mount or form an abutting connection is the reliance upon mechanical connection systems, such as the use of metal leaf springs. Such springs may become mechanically damaged, suffer a diminished spring capability, or be environmentally damaged by moisture, dust, etc.

The present invention avoids the shortcomings of the prior art by the use of a modular connector that is inexpensive to manufacture, provides a sealed interconnection system, and requires no mechanical connections directly to the connector. The features of this invention, and its advantages over the prior art, will become apparent in the description which follows, particularly when read in conjunction with the accompanying drawings.

SUMMARY OF THE INVENTION

The invention hereof relates to an electrical connector for interconnecting a powered device to a power supply with a surface mount connection, such as for powering a small motor. The connector comprises an elongated housing having plural, axially oriented through holes of a first diameter, where each hole is adapted to snugly receive an electrical conductor to electrically interconnect the device and the power supply. The housing preferably includes a like plurality of concentric recesses about the holes at one end face of the housing, where the diameter of the recess is greater than the first diameter. A conductor is provided within each through hole, where the end thereof is in communication with the recess. Means are further provided to cooperate with the housing to fixedly secure the conductors within the through holes. Finally, quantities of an electrically conductive gel are placed within the recesses extending between the conductor ends to beyond the housing end face to form conductive gel leads, whereby the housing may be mounted between the powered device and the power supply to effect an electrical interconnection therebetween.

BRIEF DESCRIPTION OF THE DRAWINGS

FIGS. 2 to 5 are perspective views sequentially showing the assembly steps in manufacturing the electrical connector hereof.

DETAILED DESCRIPTION OF PREFERRED EMBODIMENTS

Figure 1:
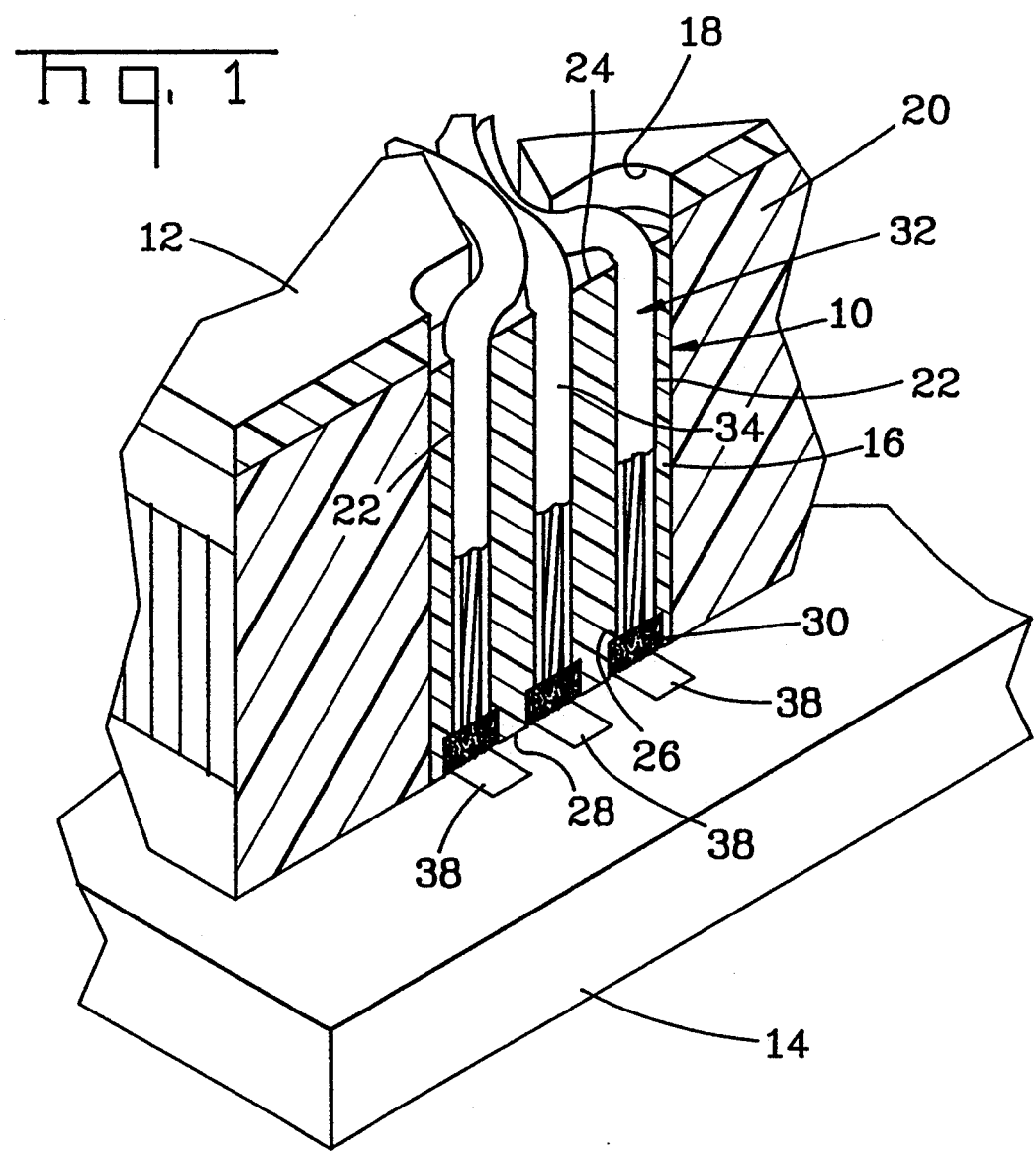
FIG. 1 is a partially sectioned, perspective view of an electrical connector according to this invention, where such connector is shown mounted on and in contact with a power supply at one end, while illustrating at the other end conductor leads to be connected to a powered device.

The present invention, in its more preferred embodiment, as illustrated in FIG. 1, is directed to an electrical connector 10 that is adapted to electrically interconnect a powered device 12, illustrated in part in FIG. 1, to a power supply 14. The connector 10 comprises an elongated, plastic housing 16, which for convenience and stability may be inserted into a slot 18 of support 20. The housing 16 preferably includes a plurality of through holes 22 of a uniform first diameter extending between a top or conductor entry end 24 and a recess 26 disposed along the lower or contact end 28. The recess 26 is essentially concentric with and preferably larger than the diameter of the hole 22, whereby to define a reservoir for receiving a conductive gel, as hereinafter explained. However, it should be understood that the diameter of the recess may be the same in selected situations.

Disposed within the recess 26, as best seen in FIGS. 4 and 5, is a quantity of a conductive gel 30. A conductive gel, as known in the art, comprises a polymeric conductor system in which a plurality of conductive particles, such as silver particles or other conductive particles, are dispersed within an insulative gel-like medium, typically a silicone composition. The conductive gel possesses a memory and is conformable to the recess prior to interconnection of the associated conductors. The gel is not in a liquid state and is sufficiently coherent and viscous that it will not flow from the recess means under the influence of gravity. The gel will also conform to the interface between the housing recess and the conductors or pads upon interconnection. Upon disconnection, however, the gel will return substantially to its original shape and remain within the housing recesses. For a preferred conductive gel composition, reference is made to copending application U.S. Ser. No. 07/902,255, filed Jun. 22, 1992, abandoned in favor of a continuation application, U.S. Ser. No. 08/123,595, filed Sep. 20, 1993, which teaches a silicone gel having a combination of conductive particles comprising silver coated mica and silver flakes uniformly dispersed within the gel.

As best seen in FIGS. 1 and 4, electrical conductors 32, preferably provided with an insulative layer 34 or wrap thereabout, are inserted into the holes 22 which are dimensioned to snugly receive the conductors 32. The conductors 32 are pushed down through the housing 16 until the conductor ends 36 are in communication with the respective recesses 26. In some situations, an uninsulated conductor, such as a solid pin, may be press fit into the hole 22. Thereafter, as noted in FIG. 4, a quantity of conductive gel 30 is placed in each recess 26, or reservoir, or hole end, in contact with the conductor end 36. The exposed conductive gel 30 is shaped to extend below the contact end 28, which, as will be explained hereinafter, will contact corresponding pads 38 on the power supply, for example, see FIG. 1.

For alignment and support, the housing 16 may be provided with a polarizing rib 40 extending along a side thereof, where such rib is slidably received within a corresponding groove, not shown, in the support 20.

Figure 6:
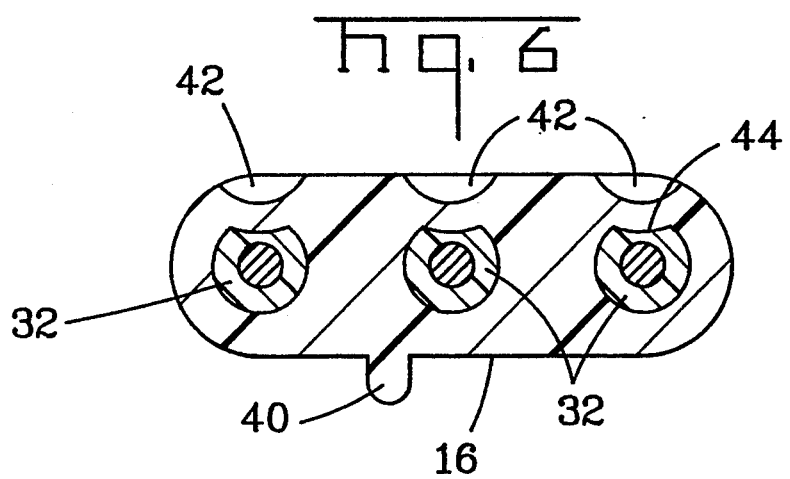
FIG. 6 is an enlarged, transverse sectional view taken through the electrical connector hereof, illustrating a preferred manner of securing the conductors therewithin.

In the sectional view of FIG. 6, one method is presented to fixedly secure the conductors 32 within the plastic housing 16. By a procedure known in the art as heat staking, the conductors may be wedged or crimped in position. That is, localized heat is applied to the housing wall 42 causing the wall to soften and yield, and be displaced toward the conductor. When the plastic hardens, an interference bump 44 bears against the conductor 32 to prevent its premature withdrawal from the housing.

Figure 7:
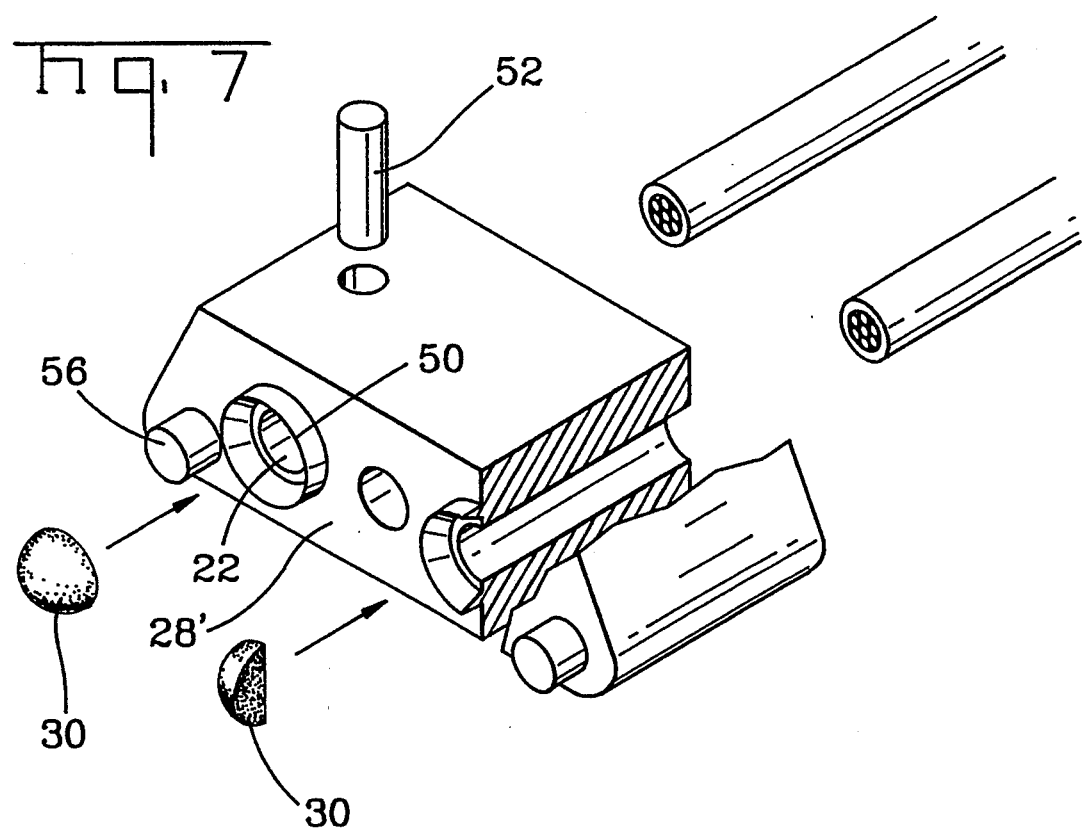
FIG. 7 is a partially sectioned, perspective view of a modified connector housing, further illustrating a second means for securing the conductors therewithin.
Figure 8:
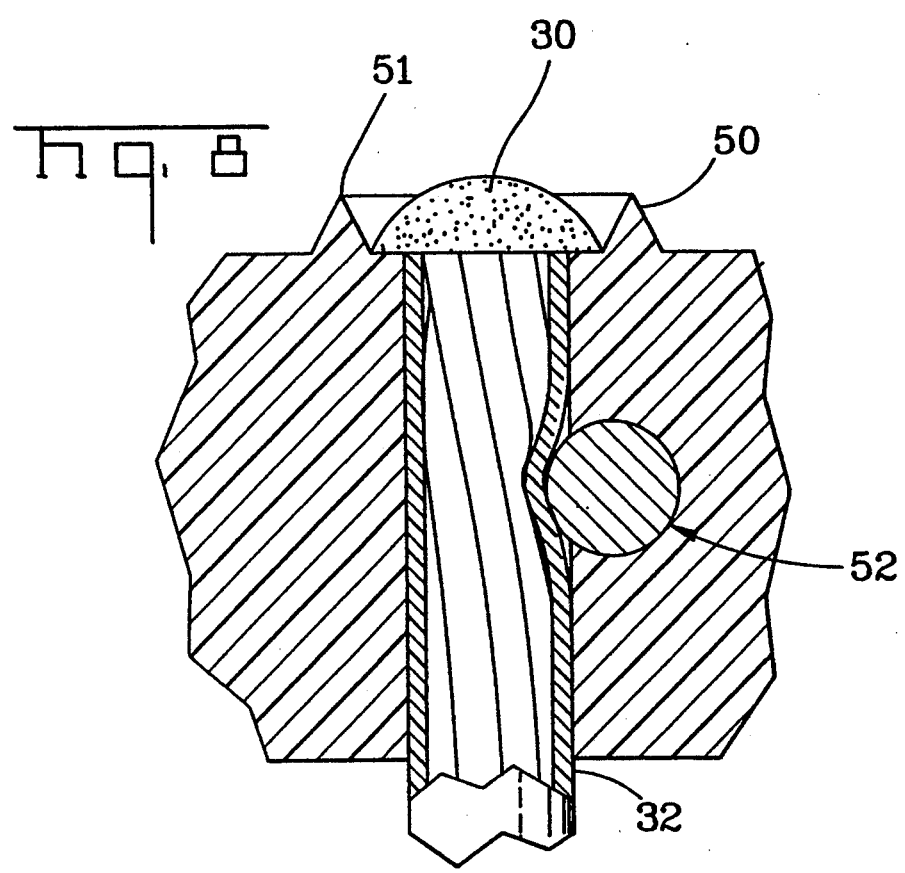
FIG. 8 is an enlarged, transverse sectional view of the connector of FIG. 7, but in an assembled condition.

FIGS. 7 and 8 represent several modifications to the electrical connector of this invention. The housing end 28' is modified by the inclusion of a continuous circular flange 50 about the through hole 22, where such flange provides a containment rim for the gel 30. Further the fine edge 51 (FIG. 8) yields upon contact with the abutting surface to effect a seal against moisture coming in or gel spreading to cause a shorting of the conductors. Additionally, a transverse pin 52 may be included as the compressive means 54, see FIG. 8, to fixedly engage the conductor 32 within the housing 16'. Finally, alignment projections 56 may be provided along the end 28' for mating in corresponding holes or recesses of the connecting member.

While the preferred embodiments have the conductors 32 intended to interconnect with the powered device, and the conductive gel 30 in contact with the power supply, it will be understood that the respective functions may be switched in accordance with the teachings of this invention, and in fact gel could be used as the interconnection means at both ends of the conductors.

I claim:

1. An electrical connector for interconnecting a powered device to a power supply with a surface mount connection, said connector comprising an elongated housing having plural, axially oriented through holes having an essentially uniform diameter and extending between a top end and a contact end, where each hole is adapted to snugly receive an electrical conductor to electrically interconnect said device and said power supply, a respective said conductor within each said through hole, where at least one end of each said conductor within its corresponding hole is spaced a distance from said contact end, means cooperating with said housing to fixedly secure said conductors within said through holes, and quantities of an electrically conductive gel within said holes extending between said conductor to beyond said contact end to form conductive gel leads, whereby said housing may be mounted between said powered device and said power supply to effect an electrical interconnection therebetween.

2. The electrical conductor according to claim 1, wherein said housing along said contact end is provided with a like plurality of recesses having diameters greater than the diameter of said through holes, where each recess is concentric with a respective through hole to provide a reservoir for said gel.

3. The electrical connector according to claim 2, wherein said power supply is a planar electronic device having a like plurality of contact pads along a surface thereof, where said connector is surface mounted to said device and each said conductive gel lead is aligned with a corresponding contact pad.

4. The electrical connector according to claim 2, wherein said conductors include an insulation layer thereabout over at least a portion of the conductors within said through holes, and said cooperating means includes at least a portion of said housing compressed against said insulation layer.

5. The electrical connector according to claim 2, wherein said conductors include an insulation layer thereabout over at least a portion of the conductors within said through holes, and said cooperating means includes a pin inserted transversely through said housing in contact with said insulation layer.

6. The electrical connector according to claim 2, wherein said housing includes a polarizing rib externally thereof to effect mounting and alignment of the connector between said powered device and said power supply.

* * * * *